(12) United States Patent
Chen et al.

(10) Patent No.: US 9,547,196 B2
(45) Date of Patent: Jan. 17, 2017

(54) ARRAY SUBSTRATE AND MANUFACTURING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaochuan Chen, Beijing (CN); Shijun Wang, Beijing (CN); Lei Wang, Beijing (CN); Yanna Xue, Beijing (CN); Wenbo Jiang, Beijing (CN); Yue Li, Beijing (CN); Zhiying Bao, Beijing (CN); Wenjun Xiao, Beijing (CN); Zhenhua Lv, Beijing (CN); Yong Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/022,378

(22) PCT Filed: Jul. 21, 2015

(86) PCT No.: PCT/CN2015/084572
§ 371 (c)(1),
(2) Date: Mar. 16, 2016

(87) PCT Pub. No.: WO2016/173129
PCT Pub. Date: Nov. 3, 2016

(65) Prior Publication Data
US 2016/0320652 A1    Nov. 3, 2016

(30) Foreign Application Priority Data

Apr. 30, 2015    (CN) .......................... 2015 1 0217396

(51) Int. Cl.
*H01L 27/12* (2006.01)
*G02F 1/133* (2006.01)
(Continued)

(52) U.S. Cl.
CPC ..... *G02F 1/13363* (2013.01); *G02F 1/133512* (2013.01); *G02F 1/136286* (2013.01); *H01L 27/124* (2013.01); *H01L 27/1259* (2013.01)

(58) Field of Classification Search
CPC .......................... H01L 27/124; H01L 27/1259
See application file for complete search history.

(56) References Cited

U.S. PATENT DOCUMENTS 5,854,663 A    12/1998   Oh et al.
5,926,702 A     7/1999   Kwon et al.
(Continued)

FOREIGN PATENT DOCUMENTS

CN    103257494 A    8/2013
CN    103487932 A    1/2014
(Continued)

OTHER PUBLICATIONS

Search Report and Written Opinion Mailed Jan. 18, 2016 from State Intellectual Property Office of the P.R. China.

*Primary Examiner* — Mamadou Diallo
(74) *Attorney, Agent, or Firm* — Dilworth & Barrese, LLP.

(57) ABSTRACT

An array substrate and a manufacturing method thereof and a display are disclosed. The array substrate includes a base substrate, a plurality of sub-pixels disposed on the base substrate, and a phase shift pattern disposed on the base substrate to separate the sub-pixels; the phase shift pattern is disposed to allow light passing through the phase shift
(Continued)

pattern to undergo phase shift, and positions corresponding to the phase shift pattern are substantially opaque to light. Lateral light leakage is reduced by the phase shift pattern, and transmission rate of products become uniform, and therefore stability of products are increased.

20 Claims, 4 Drawing Sheets

(51) Int. Cl.
  *G02F 1/13363* (2006.01)
  *G02F 1/1362* (2006.01)
  *G02F 1/1335* (2006.01)

(56) References Cited

U.S. PATENT DOCUMENTS

| | | | | |
|---|---|---|---|---|
| 6,072,631 | A * | 6/2000 | Guenther et al. | G02B 5/32 359/565 |
| 2008/0024413 | A1 * | 1/2008 | Minami et al. | G09G 3/3233 345/90 |
| 2010/0255409 | A1 * | 10/2010 | Kang et al. | G03F 1/32 430/5 |
| 2011/0164258 | A1 * | 7/2011 | Nakamura | G06T 1/00 358/1.2 |
| 2014/0055695 | A1 * | 2/2014 | Miller et al. | G02F 1/133504 349/18 |
| 2015/0234221 | A1 * | 8/2015 | Anderson et al. | G02F 1/13363 349/113 |
| 2015/0255493 | A1 * | 9/2015 | Shim et al. | H01L 27/1288 257/72 |
| 2015/0293438 | A1 * | 10/2015 | Lee et al. | G03F 1/26 430/5 |

FOREIGN PATENT DOCUMENTS

| | | |
|---|---|---|
| CN | 104765216 A | 7/2015 |
| JP | H05188385 A | 7/1993 |
| JP | 2000231123 A | 8/2000 |

* cited by examiner

ARRAY SUBSTRATE AND MANUFACTURING METHOD THEREOF AND DISPLAY DEVICE

TECHNICAL FIELD

Embodiments of the present disclosure relate to an array substrate and a manufacturing method thereof and a display device.

BACKGROUND

TFT-LCDs (Thin Film Transistor Liquid Crystal Displays) are more and more used in high-performance display field as flat panel display devices because of the following features such as small size, low power consumption, no radiation and relatively lower manufacturing cost.

A TFT-LCD panel usually includes an array substrate and a color filter substrate that are cell-assembled together. A liquid crystal layer is disposed between the array substrate and the color filter substrate. For example, an array substrate includes a plurality of scanning signal lines (S1-Sn) and a plurality of data signal lines (D1-Dn), the plurality of scanning signal lines and the plurality of data signal lines cross each other along a horizontal direction and a vertical direction respectively to define a plurality of sub-pixels. A color filter substrate can include a color film layer and a black matrix pattern, the black matrix pattern correspond to opaque portions for light, such as scanning signal lines and data signal lines, on the array substrate. The color film layer is divided into a plurality of color units by the black matrix pattern. The color units on the color filter substrate and the sub-pixels on the array substrate correspond in a one-one relationship.

However, in a manufacturing process of TFT-LCD devices, a position deviation can happens in the cell-assembling process of an array substrate and a color filter substrate, and light transmission rate of a product is reduced. At the same time, uniformity of light transmission rate is bad between different products, and also between products in different batches because of different cell-assembled precision. Especially with regard to products with high PPI (Pixels Per Inch), fluctuation of light transmission rate can reach up to 30%, and better customer experience cannot be obtained.

SUMMARY

At least one embodiment of the disclosure provides an array substrate and a manufacturing method thereof and a display device to improve uniformity of light transmission rate of a display device.

At least one embodiment of the disclosure provides an array substrate comprising a base substrate, a plurality of sub-pixels disposed on the base substrate, and a phase shift pattern disposed on the base substrate to separate the sub-pixels; the phase shift pattern is disposed to allow light passing through the phase shift pattern to undergo phase shift, and positions corresponding to the phase shift pattern are substantially opaque to light.

For example, the array substrate further comprises a plurality of data signal lines and a plurality of scanning signal lines that intersect and are insulated from the plurality of data signal lines, and the plurality of data signal lines intersect the plurality of scanning signal lines to define the plurality of sub-pixels.

For example, a projection of the phase shift pattern on the base substrate covers a projection of the plurality of data signal lines and/or a projection of the plurality of scanning signal lines on the base substrate.

For example, the phase shift pattern is formed by the plurality of scanning signal lines and/or the plurality of data signal lines disposed on the base substrate.

For example, the phase shift pattern comprises two portions, a projection of one portion of which on the base substrate covers a projection of the plurality of scanning signal lines on the base substrate, and the other portion of the phase shift pattern is formed by the plurality of data signal lines disposed on the base substrate.

For example, the phase shift pattern comprises two portions, a projection of one portion of which on the base substrate covers a projection of the plurality of data signal lines on the base substrate, and the other portion of the phase shift pattern is formed by the plurality of scanning signal lines disposed on the base substrate.

For example, the material of the phase shift pattern is a material to allow light passing through the phase shift pattern to undergo phase shift.

For example, the material of the phase shift pattern is MoSiON.

For example, the phase shift pattern allows light passing through the phase shift pattern to have a phase shift of about 180°.

At least one embodiment of the disclosure provides a manufacturing method of the array substrate comprising: forming a plurality of sub-pixels on the base substrate, and forming a phase shift pattern on the base substrate to separate the sub-pixels; the phase shift pattern is disposed to allow light passing through the phase shift pattern to undergo phase shift, and positions corresponding to the phase shift pattern are substantially opaque to light.

For example, the method further comprises forming a plurality of data signal lines, and forming a plurality of scanning signal lines that intersect and are insulated from the plurality of data signal lines; the plurality of data signal lines intersect the plurality of scanning signal lines to define the plurality of sub-pixels.

For example, in the method, a projection of the phase shift pattern on the base substrate covers a projection of the plurality of data signal lines and/or a projection of the plurality of scanning signal lines on the base substrate.

For example, in the method, the phase shift pattern is formed by the plurality of scanning signal lines and/or the plurality of data signal lines formed on the base substrate.

For example, in the method, the phase shift pattern comprises two portions, a projection of one portion of which on the base substrate covers a projection of the plurality of scanning signal lines on the base substrate, and the other portion of the phase shift pattern is formed by the plurality of data signal lines formed on the base substrate.

For example, in the method, the phase shift pattern comprises two portions, a projection of one portion of which on the base substrate covers a projection of the plurality of data signal lines on the base substrate, and the other portion of the phase shift pattern is formed by the plurality of scanning signal lines formed on the base substrate.

For example, in the method, the material of the phase shift pattern is a material to allow light passing through the phase shift pattern to undergo phase shift.

For example, in the method, the material of the phase shift pattern is MoSiON.

For example, in the method, the phase shift pattern allows light passing through the phase shift pattern to have a phase shift of about 180°.

At least one embodiment of the disclosure provides a display device comprising any one of the above-mentioned array substrate and an opposing substrate disposed opposite to the array substrate.

For example, no black matrix pattern is disposed on the base substrate of the array substrate and a base substrate of the opposing substrate.

For example, the phase shift pattern is formed by the plurality of data signal lines, and a black matrix pattern is disposed on the base substrate of the array substrate or the opposing substrate to correspond to the plurality of scanning signal lines on the base substrate of the array substrate.

For example, the phase shift pattern is formed by the plurality of scanning signal lines, and a black matrix pattern is disposed on the base substrate of the array substrate or the opposing substrate to correspond to the plurality of data signal lines on the base substrate of the array substrate.

For example, a black matrix pattern is disposed on the base substrate of the array substrate or the opposing substrate to correspond to the phase shift pattern, and a width of the black matrix pattern is smaller than a width of the phase shift pattern.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

10—array substrate; 20—opposing substrate; 20'—color filter substrate; 201'—base substrate of a color filter substrate; 201—base substrate of an opposing substrate; 30—backlight source; 101—base substrate of an array substrate; 102—sub-pixel; 103—phase shift pattern; 104—scanning signal line; 105—data signal line; 106—pixel electrode; 107—thin film transistor; 1071—gate electrode; 1072—source electrode; 1073—drain electrode; 202—black matrix pattern; 203—color film layer; d1—pixel pitch of a sub-pixel; d2—transmission width of a sub-pixel; 1031—light extinction area; 301—light not passing through a phase shift pattern; 302—light passing through a phase shift pattern.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
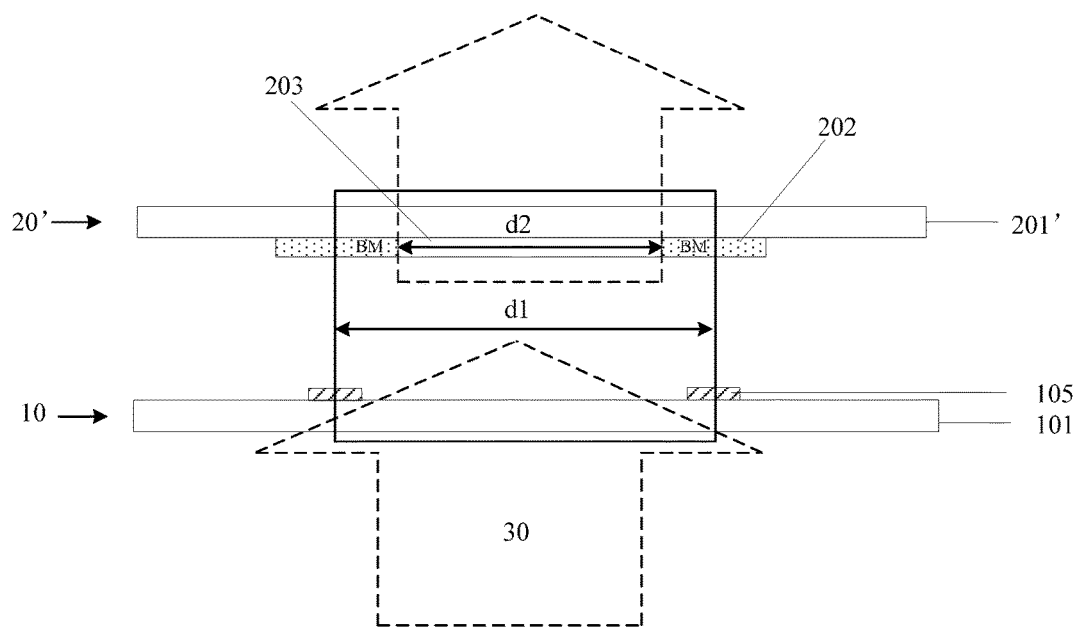
FIG. 1 is a cell-assembling schematic view of a TFT-LCD device.

FIG. 1 shows a cell-assembling schematic view of a TFT-LCD device, the TFT-LCD device comprises an array substrate 10 and a color filter substrate 20', the array substrate 10 comprises a plurality of data signal lines 105, and the color filter substrate 20' comprises a base substrate 201', and a black matrix pattern 202 and a color film layer 203 disposed on the base substrate 201'. The TFT-LCD device further comprises a backlight source 30.

For example, taking a TFT-LCD device with 400 PPI as an example, a pixel pitch of a sub-pixel (a width of a sub-pixel in one direction) d1 is 21 μm, and total pixel pitch of the sub-pixel is 21×63 μm. If a light transmission width of a sub-pixel d2 is 15 μm, a width of a black matrix pattern is 6 μm, a width of a data signal line is 4 μm, then in the case that an assembling precise (position deviation or bias) is zero, this state is optimum, and a transmission rate is 15/21=71.4%. In the case that an assembling precise is 3 μm, a transmission rate is 12/21=57.1%. An absolute value difference between the transmission rates when the assembling precise is zero and when the assembling precise is 3 μm is 14.3%, and a luminance difference about 100 nit (unit of illuminative brightness) will be produced. Therefore, uniformity of products is bad.

Figure 2:
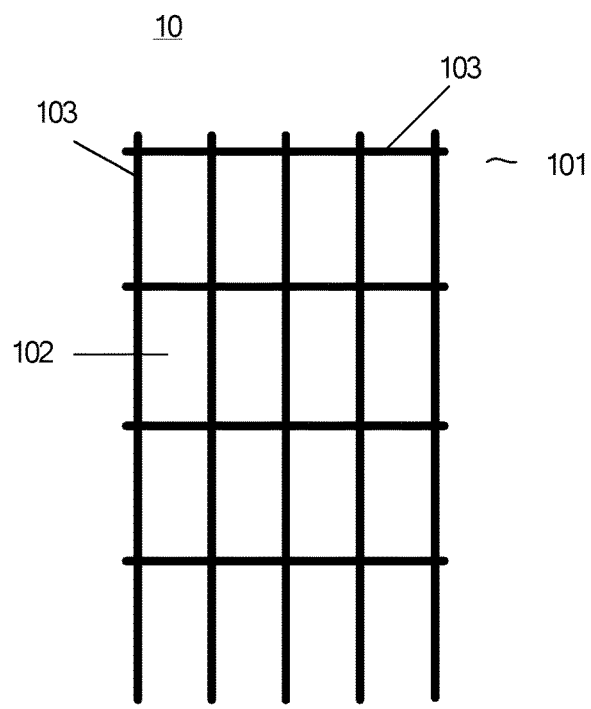
FIG. 2 is a top schematic view of an array substrate provided by an embodiment of the disclosure.

An embodiment of the disclosure provides an array substrate 10, as illustrated in FIG. 2, comprising a base substrate 101, a plurality of sub-pixels 102 disposed on the base substrate 101, a phase shift pattern 103 disposed on the base substrate 101 to separate the sub-pixels 102; the phase shift pattern 103 is disposed to allow light passing through the phase shift pattern 103 to undergo phase shift, and therefore positions corresponding to the phase shift pattern are substantially opaque to light. The plurality of sub-pixels 102 are arranged in a regular matrix pattern as illustrated in the figure for example; or adjacent rows can stagger to each other by a certain distance for example, and limitations are not imposed thereto.

Figure 3:
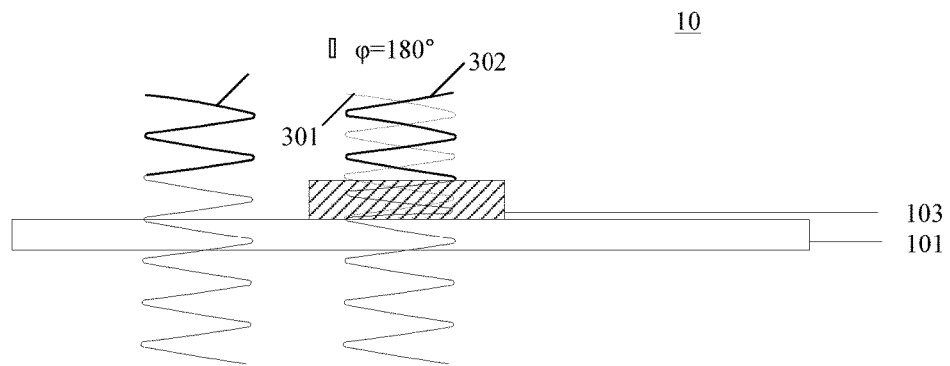
FIG. 3 is a cross-section schematic view of an array substrate provided by an embodiment of the disclosure and a schematic view of phase shift of a phase shift pattern.

FIG. 3 shows a cross-section schematic view of an array substrate provided by an embodiment of the disclosure and a schematic view of phase shift of a phase shift pattern. For example, a phase change about 180° (π) of light may be produced after light passes through a phase shift pattern 103, a negative or positive deviation from 180 degree is smaller than 5 degree for example, smaller than 3 degree for example. Energy (light strength) of light 302 passing through the phase shift pattern and energy of light 301 not passing through the phase shift pattern can counteract above the phase shift pattern, light extinction is produced, and in this way the area above the phase shift pattern is substantially opaque to light, therefore light leakage and color cross-talk are prevented. For example, the light transmission rate of the corresponding area of the phase shift pattern is about 5%.

For example, the relationship among a phase shift angle $\Delta_\phi$, a thickness of a phase shift pattern and a refraction index of a phase shift pattern are as follows:

$$\Delta_\phi = 2\pi((n-1)d/\lambda$$

where d is a thickness of a phase shift pattern, λ is a wavelength of light, and n is a refraction index of the phase shift pattern.

Figure 4:
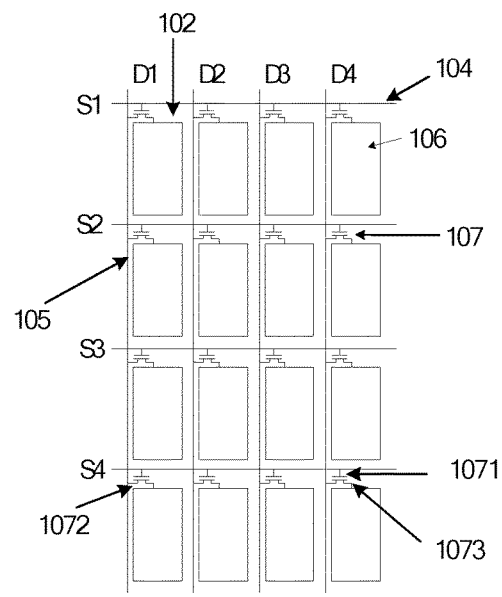
FIG. 4 is a top schematic view of an array substrate provided by another embodiment of the disclosure.

For example, another embodiment of the disclosure provides an array substrate, as illustrated in FIG. 4, the array substrate 10 further comprises a plurality of data signal lines 105 parallel to each other and a plurality of scanning signal lines 104 that intersect and are insulated from the plurality of data signal lines 105, and the plurality of data signal lines 105 intersect the plurality of scanning signal lines 104 to define a plurality of sub-pixels 102. For example, a sub-pixel 102 comprises a data signal line 105, a scanning signal line 104, a pixel electrode 106 and a thin film transistor 107. It is to be noted that, the sub-pixels 102 can be arranged as illustrated in FIG. 4 or in other arranging patterns, limitations are not imposed thereto.

Figure 5A:
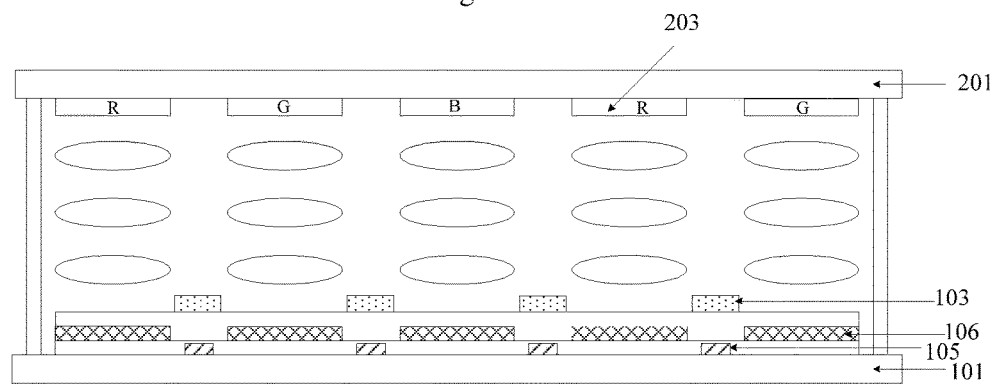
FIG. 5a is a schematic view of an array substrate, in which a projection of a phase shift pattern on the base substrate covers a projection of a plurality of data signal lines on the base substrate, provided by an embodiment of the disclosure.
Figure 5B:
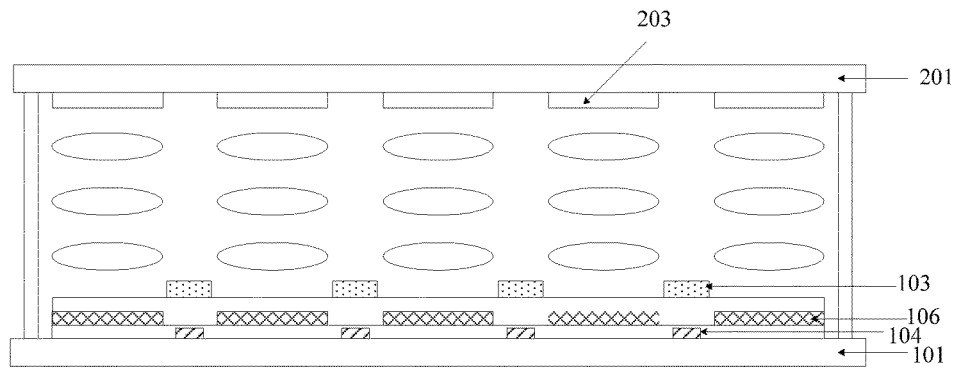
FIG. 5b is a schematic view of an array substrate, in which a projection of a phase shift pattern on the base substrate covers a projection of a plurality of scanning signal lines on the base substrate, provided by an embodiment of the disclosure.

For example, in the case that sub-pixels 102 are arranged as illustrated in FIG. 4, a phase shift pattern 103 can be as illustrated in FIG. 5a and FIG. 5b, a projection of the phase shift pattern 103 on the base substrate 101 covers a projection of data signal lines 105 (as illustrated in FIG. 5a) and scanning signal lines 104 on the base substrate 101, or only covers a projection of data signal lines 105 or scanning signal lines 104 on the base substrate 101.

For example, another embodiment of the disclosure provides an array substrate comprising a base substrate 101, a plurality of sub-pixels 102 disposed on the base substrate 101, a phase shift pattern 103 disposed on the base substrate 101 to separate the sub-pixels 102; the phase shift pattern 103 is disposed to allow light passing through the phase shift pattern 103 to undergo phase shift, and therefore positions corresponding to the phase shift pattern are substantially opaque to light, as illustrated in FIG. 2. The array substrate 10 further comprises a plurality of data signal lines 105 parallel to each other and a plurality of scanning signal lines 104 that intersect and are insulated from the plurality of data signal lines 105, and the plurality of data signal lines 105 intersect the plurality of scanning signal lines 104 to define a plurality of sub-pixels 102, which can be illustrated in FIG. 4. The phase shift pattern 103 comprises two portions, a projection of one portion on the base substrate 101 covers a projection of scanning signal lines 104 on the base substrate 101, the other portion of the phase shift pattern 103 is formed by data signal lines 105 disposed on the base substrate 101, which can be illustrated in FIG. 5a and FIG. 5b. The phase shift pattern 103 is made of a phase-shift material. Therefore, only a projection of one part of the phase shift pattern 103 on the base substrate 101 is needed to cover a projection of scanning signal lines 104 on the base substrate 101.

It is to be noted that, a phase shift pattern disposed on the base substrate to separate the sub-pixels in the embodiments of the disclosure, the term "separate" herein can mean to separate the sub-pixels in a horizontal direction, can also mean to separate the sub-pixels in a vertical direction, or to separate the sub-pixels in both a horizontal and a vertical directions, or to separate in other ways. Limitations are not imposed thereto.

Figure 5C:
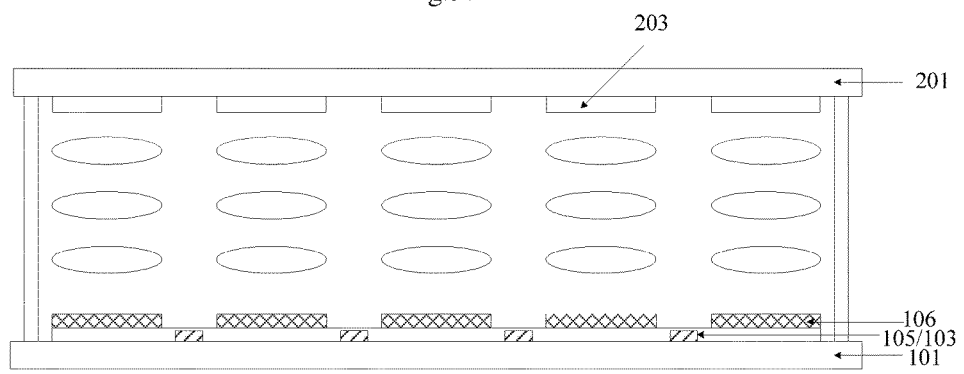
FIG. 5c is a schematic view of an array substrate, in which a plurality of data signal lines disposed on the base substrate form a phase shift pattern, provided by an embodiment of the disclosure.
Figure 5D:
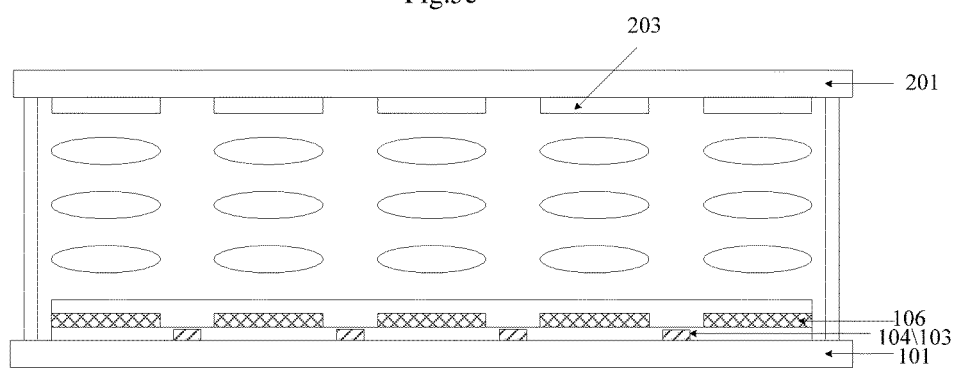
FIG. 5d is a schematic view of an array substrate, in which a plurality of scanning signal lines disposed on the base substrate form a phase shift pattern, provided by an embodiment of the disclosure.

For example, another embodiment of the disclosure provides an array substrate. The phase shift pattern 103 of the array substrate comprises two portions, a projection of one portion on the base substrate 101 covers a projection of data signal lines 105 on the base substrate 101, the other portion of the phase shift pattern 103 is formed by scanning signal lines 104 disposed on the base substrate 101, which can be illustrated in FIG. 5a and FIG. 5d. The phase shift pattern 103 is made of a phase-shift material.

For example, another embodiment of the disclosure provides an array substrate. In the array substrate, the phase shift pattern 103 is formed by scanning signal lines 104 and data signal lines 105 disposed on the base substrate 101, the phase shift pattern is disposed to allow light passing through the phase shift pattern 103 to undergo phase shift, and therefore positions corresponding to the phase shift pattern 103 are substantially opaque to light. In this case, the phase shift pattern 103 comprises two portions: scanning signal lines 104 to form the phase shift pattern and data signal lines 105 to form the phase shift pattern, which can be illustrated in FIG. 5c and FIG. 5d.

It is to be noted that, the phase shift pattern 103 can be only located in one layer, in this case, a projection of the phase shift pattern on the base substrate covers a projection of data signal lines and scanning signal lines on the base substrate. The phase shift pattern 103 can be formed by data signal lines and scanning signal lines, or one portion of the phase shift pattern 103 can be formed by data signal lines or scanning signal lines.

For example, the material of the phase shift pattern 103 chooses a material that can allow light passing through itself to undergo phase shift. That is, the phase shift pattern is made of a phase-shift material, and can choose transparent oxide, for example; the material of the phase shift pattern can choose MoSiON, which is an oxide material including Mo, Si, and N. The MoSiON material can be prepared by a magnetron sputtering method, for example, can be prepared by a magnetron sputtering method in a vacuum atmosphere with a target material of MoSiON, or can be prepared by a magnetron sputtering method in a vacuum atmosphere including oxygen and nitrogen taking MoSi as a target material, or can be prepared by a chemical vapor deposition (CVD) method. Limitations are not imposed thereto. The phase shift pattern can also be of other materials having the property to allow light passing through the phase shift pattern to undergo phase shift, limitations are not imposed thereto.

For example, a thickness of a phase shift pattern can be calculated by following formula:

$$d = \lambda \cdot \Delta_\phi / 2\pi((n-1)$$

where $\Delta_\varphi$ is a phase shift angle (for example, $\Delta_\varphi$ is $\pi$), $\lambda$ is a wavelength of light, n is a refraction index of a phase shift pattern.

For example, as illustrated in FIG. 4, the array substrate 10 further comprises a plurality of thin film transistors 107 configured to respectively switch on or off a plurality of sub-pixels, each of the thin film transistors includes a gate electrode 1071, a source electrode 1072, and a drain electrode 1073, and further includes an active layer, the source electrode 1072 and the drain electrode 1073 can be disposed in a same layer as data signal lines, and the materials of them are the same. In the case that data signal lines form a phase shift pattern, the material of the source electrode 1072 and the drain electrode 1073 and that of data signal lines are the same, the material of the source electrode and the drain electrode has a property of phase shift, which configuration is favorable for preparation For example, the material of scanning signal lines 104 is the same as the material of gate electrodes 1071, and for example, can use a metal material. In the case that the scanning signal lines 104 form the phase shift pattern, and the gate electrodes 1071 may be of the same material as the scanning signal lines 104, and therefore has a property of phase shift, which configuration is favorable for preparation.

For example, in the case that scanning signal lines 104 and data signal lines 105 does not form the phase shift pattern, and they can be made of a normal material, for example, can be made of metal materials. In the case that scanning signal lines 104 and/or data signal lines 105 form the phase shift pattern, they can be made of a phase shift material.

It is to be noted that, embodiments of the disclosure take the case that a plurality of data signal lines formed on the base substrate are parallel to each other as an example to illustrate, and the plurality of data signal lines can be not parallel to each other; limitations are not imposed thereto.

At least one embodiment of the disclosure further provides a manufacturing method of the array substrate comprising the following steps.

A plurality of sub-pixels 102 are formed on the base substrate 101, and a phase shift pattern 103 is formed on the base substrate 101 to separate the sub-pixels 102; the phase shift pattern 103 is disposed to allow light passing through the phase shift pattern 103 to undergo phase shift, and positions corresponding to the phase shift pattern 103 are substantially opaque to light.

For example, the method further comprises forming a plurality of data signal lines 105 parallel to each other, and forming a plurality of scanning signal lines 104 that intersect and are insulated from the plurality of data signal lines 105, and the plurality of data signal lines 105 intersect the plurality of scanning signal lines 104 to define a plurality of sub-pixels 102.

For example, in the manufacturing method of the array substrate, a projection of the phase shift pattern 103 on the base substrate 101 covers a projection of data signal lines 105 and/or scanning signal lines 104 on the base substrate 101.

For example, in the manufacturing method of the array substrate, the phase shift pattern 103 comprises two portions, a projection of one portion on the base substrate 101 covers a projection of scanning signal lines 104 on the base substrate 101, and the other portion of the phase shift pattern 103 is formed by data signal lines 105 formed on the base substrate 101.

For example, in the method, the phase shift pattern 103 comprises two portions, a projection of one portion of which on the base substrate 101 covers a projection of data signal lines 105 on the base substrate 101, and the other portion of the phase shift pattern 103 is formed by scanning signal lines 104 formed on the base substrate 101.

For example, in the manufacturing method of the array substrate, the phase shift pattern 103 is formed by data signal lines 105 and/or scanning signal lines 104 formed on the base substrate 101.

For example, in the manufacturing method of the array substrate, the material of the phase shift pattern 103 is MoSiON. The manufacturing method of the phase shift pattern can be as above-mentioned.

For example, the manufacturing method of the array substrate 10 further comprises forming a plurality of thin film transistors 107 configured to respectively switch on or off a plurality of sub-pixels; each of thin film transistors includes a gate electrode 1071, a source electrode 1072, and a drain electrode 1073, and further includes an active layer, the source electrode 1072 and the drain electrode 1073 can be disposed in a same layer as data signal lines, and the materials of them are same.

For example, in the manufacturing method of the array substrate, the material of scanning signal lines 104 is the same as that of the gate electrode 1071.

At least one embodiment of the disclosure provides a display device comprising any one of the above-mentioned array substrate 10 as well as an opposing substrate 20. Liquid crystal is sealed between the array substrate and the opposing substrate with a sealant, for example, which can be illustrated in FIG. 6 or FIG. 7.

It is to be noted that, the opposing substrate is disposed opposite to the array substrate, the opposing substrate and the array substrate are a lower substrate and an upper substrate of a display panel respectively, display structures such as thin film transistor array are usually formed on the array substrate, and color resins are formed on the opposing substrate. For example, an opposing substrate 20 includes a base substrate 201, and a color film layer 203 disposed on the base substrate 201. For example, the opposing substrate 20 is a color filter substrate.

For the display devices provided by embodiments of the disclosure, in the case that an assembling tolerance is 3 μm, the transmission rate of the panel can be unchanged, and high uniformity remains.

Figure 6:
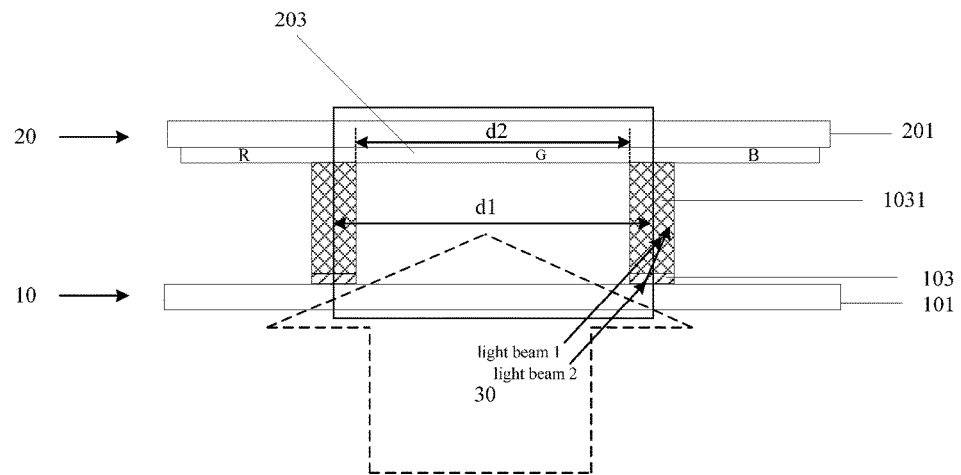
FIG. 6 is a structural schematic view of a light extinction area of a TFT-LCD, in which an array substrate includes a phase shift pattern and no black matrix pattern is disposed on the base substrates of both the array substrate and an opposing substrate, provided by an embodiment of the disclosure.

For example, as illustrated in FIG. 6, no black matrix pattern is disposed on the base substrate of the array substrate and on the base substrate of the opposing substrate. A phase change of about 180° for light may be produced after the light passes through a phase shift pattern 103. Energy (light strength) of light 302 passing through the phase shift pattern and energy of light 301 not passing through the phase shift pattern can counteract each other above the phase shift pattern, light extinction is produced, a light extinction area 1031 is formed, and the area above the phase shift pattern is substantially opaque to light, and therefore light leakage and color cross-talk are prevented.

It is to be noted that, a black matrix pattern can be disposed on the base substrate of the opposing substrate. For example, the phase shift pattern is only formed by a plurality of data signal lines 105, a black matrix pattern can be disposed on the base substrate of the opposing substrate corresponding to a plurality of scanning signal lines on the array substrate, to prevent light leakage and color cross-talk. For another example, the phase shift pattern is only formed by a plurality of scanning signal lines, a black matrix pattern can be disposed on the base substrate of the opposing substrate to correspond to a plurality of data signal lines on the array substrate. The black matrix pattern can also be disposed on the base substrate of the array substrate.

Figure 7:
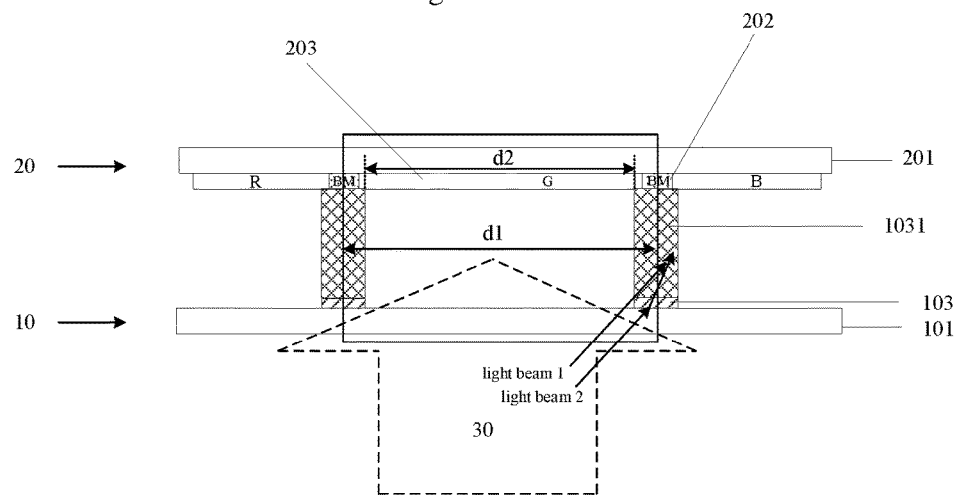
FIG. 7 is a structural schematic view of a TFT-LCD including a phase shift pattern and a black matrix pattern provided by an embodiment of the disclosure.

For example, as illustrated in FIG. 7, at least one embodiment of the disclosure provides a display device comprising any one of the above-mentioned array substrate 10 as well as an opposing substrate 20. A black matrix pattern 202 corresponding to the phase shift pattern 103 is disposed on the base substrate 201 of the opposing substrate 20, and a width of the black matrix pattern 202 is smaller than a width of the phase shift pattern 103. Therefore, the width of the black matrix pattern 202 becomes smaller, assembling deviation is reduced, and the transmission rate of a panel is increased, so that high uniformity of transmission rate of panels is obtained. The black matrix pattern 202 can also be disposed on the base substrate of the array substrate.

It is to be noted that, embodiments and the drawing thereof of the disclosure illustrate the components involved in the embodiments of the disclosure, other structures, such as common electrodes, common electrode lines and the like are not illustrated here. The components not described can refer to conventional design.

Display devices provided by embodiments of the disclosure can be a VA display mode, or can be an ADS display mode, a TN display mode or an IPS display mode, and limitations are not imposed thereto.

For example, pixel electrodes and common electrodes are in different layers. The common electrode layer located on the top of the array substrate can be slit-shaped, and pixel electrodes close to the base substrate can be plane-shaped. A display device adopting the above-mentioned array substrate is an AD-ADS (Advanced-super Dimensional Switching) type display device. ADS technology uses multidimensional electric field formed by a parallel electric field generated by edges of common electrodes in a same layer and a vertical electric field between pixel electrode layer and common electrode layer, to make liquid crystal molecules at alignment in the liquid crystal cell and between the pixel electrodes and above all the electrodes to undergo rotation, and working efficiency of liquid crystal of plane alignment is raised and light transmission efficiency is increased.

For example, in the case that a common electrode layer is manufactured on the opposing substrate that is cell-assembled with an array substrate, the display device is a TN type display device. The difference is that, a TN type display device is a liquid crystal display device adopting a vertical electric field principle, a nematic mode liquid crystal is driven by a vertical electric filed formed between the common electrode layer disposed on the opposing substrate and the pixel electrode layer on the array substrate. The TN type display device has an advantage of high aperture ratio, while has a disadvantage of narrow view about 90°.

At least one embodiment of the disclosure provides an array substrate comprising a base substrate, a plurality of sub-pixels disposed on the base substrate, a phase shift pattern disposed on the base substrate to separate the sub-pixels; the phase shift pattern is disposed to allow light passing through the phase shift pattern to undergo phase shift, and positions corresponding to the phase shift pattern are substantially opaque to light. Light passing through (penetrating) the phase shift pattern can experience phase shift and can counteract light not passing through the phase shift pattern so as to make lateral light leakage reduce greatly, while a black matrix pattern on the opposing substrate can be removed or a part of the black matrix pattern is retained, so that transmission rate of panels are uniform in the case that a cell-assembling deviation exits, and high uniformity is realized. Consistency of products is increased greatly, and the good effects are notable especially in products with high PPI.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

This application claims the benefit of priority from Chinese patent application No. 201510217396.X, filed on Apr. 30, 2015, the disclosure of which is incorporated herein in its entirety by reference as a part of the present application.

What is claimed is:

1. An array substrate comprising a base substrate, a plurality of sub-pixels disposed on the base substrate, and a phase shift pattern disposed on the base substrate to separate the sub-pixels,
wherein the phase shift pattern is disposed to allow light passing through the phase shift pattern to undergo phase shift, and positions corresponding to the phase shift pattern are substantially opaque to light.

2. The array substrate according to claim 1, further comprising a plurality of data signal lines and a plurality of scanning signal lines that intersect and are insulated from the plurality of data signal lines,
wherein the plurality of data signal lines intersect the plurality of scanning signal lines to define the plurality of sub-pixels.

3. The array substrate according to claim 2, wherein a projection of the phase shift pattern on the base substrate covers a projection of the plurality of data signal lines and/or a projection of the plurality of scanning signal lines on the base substrate.

4. The array substrate according to claim 2, wherein the phase shift pattern is formed by the plurality of scanning signal lines and/or the plurality of data signal lines disposed on the base substrate.

5. The array substrate according to claim 2, wherein the phase shift pattern comprises two portions, a projection of one portion of which on the base substrate covers a projection of the plurality of scanning signal lines on the base substrate, and the other portion of the phase shift pattern is formed by the plurality of data signal lines disposed on the base substrate.

6. The array substrate according to claim 2, wherein the phase shift pattern comprises two portions, a projection of one portion of which on the base substrate covers a projection of the plurality of data signal lines on the base substrate, and the other portion of the phase shift pattern is formed by the plurality of scanning signal lines disposed on the base substrate.

7. The array substrate according to claim 1, wherein a material of the phase shift pattern is a material to allow light passing through the phase shift pattern to undergo phase shift.

8. The array substrate according to claim 1, wherein the phase shift pattern allows light passing through the phase shift pattern to have a phase shift of about 180°.

9. A display device comprising an array substrate according to claim 1 and an opposing substrate disposed opposite to the array substrate.

10. The display device according to claim 9, wherein no black matrix pattern is disposed on the base substrate of the array substrate and a base substrate of the opposing substrate.

11. The display device according to claim 9, wherein the phase shift pattern is formed by the plurality of data signal lines, and a black matrix pattern is disposed on the base substrate of the array substrate or the opposing substrate to correspond to the plurality of scanning signal lines on the base substrate of the array substrate.

12. The display device according to claim 9, wherein the phase shift pattern is formed by the plurality of scanning signal lines, and a black matrix pattern is disposed on the base substrate of the array substrate or the opposing substrate to correspond to the plurality of data signal lines on the base substrate of the array substrate.

13. The display device according to claim 9, wherein a black matrix pattern is disposed on the base substrate of the array substrate or the opposing substrate to correspond to the phase shift pattern, and a width of the black matrix pattern is smaller than a width of the phase shift pattern.

14. A manufacturing method of the array substrate comprising:
    forming a plurality of sub-pixels on the base substrate, and
    forming a phase shift pattern on the base substrate to separate the sub-pixels,
    wherein the phase shift pattern is disposed to allow light passing through the phase shift pattern to undergo phase shift, and positions corresponding to the phase shift pattern are substantially opaque to light.

15. The manufacturing method of the array substrate according to claim 14, further comprising: forming a plurality of data signal lines, and forming a plurality of scanning signal lines that intersect and are insulated from the plurality of data signal lines,
    wherein the plurality of data signal lines intersect the plurality of scanning signal lines to define the plurality of sub-pixels.

16. The manufacturing method of the array substrate according to claim 15, wherein a projection of the phase shift pattern on the base substrate covers a projection of the plurality of data signal lines and/or a projection of the plurality of scanning signal lines on the base substrate.

17. The manufacturing method of the array substrate according to claim 15, wherein the phase shift pattern is formed by the plurality of scanning signal lines and/or the plurality of data signal lines formed on the base substrate.

18. The manufacturing method of the array substrate according to claim 15, wherein the phase shift pattern comprises two portions, a projection of one portion of which on the base substrate covers a projection of the plurality of scanning signal lines on the base substrate, and the other portion of the phase shift pattern is formed by the plurality of data signal lines formed on the base substrate.

19. The manufacturing method of the array substrate according to claim 15, wherein the phase shift pattern comprises two portions, a projection of one portion of which on the base substrate covers a projection of the plurality of data signal lines on the base substrate, and the other portion of the phase shift pattern is formed by the plurality of scanning signal lines formed on the base substrate.

20. The manufacturing method of the array substrate according to claim 14, wherein the phase shift pattern allows light passing through the phase shift pattern to have a phase shift of about 180°.

* * * * *